United States Patent
Dip et al.

(10) Patent No.: US 7,405,140 B2
(45) Date of Patent: Jul. 29, 2008

(54) LOW TEMPERATURE FORMATION OF PATTERNED EPITAXIAL SI CONTAINING FILMS

(75) Inventors: Anthony Dip, Cedar Creek, TX (US); Allen John Leith, Austin, TX (US); Seungho Oh, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 383 days.

(21) Appl. No.: 11/206,059

(22) Filed: Aug. 18, 2005

(65) Prior Publication Data

US 2007/0042569 A1  Feb. 22, 2007

(51) Int. Cl.
*H01L 21/36* (2006.01)
*H01L 21/20* (2006.01)

(52) U.S. Cl. ............... 438/478; 438/492; 257/E21.463; 257/E21.562

(58) Field of Classification Search ................. 438/478, 438/492; 257/E21.463, E21.562
See application file for complete search history.

(56) References Cited

U.S. PATENT DOCUMENTS 5,158,901 A * 10/1992 Kosa et al. ................. 438/300
6,346,732 B1 * 2/2002 Mizushima et al. ......... 257/382
6,812,105 B1 * 11/2004 Dokumaci et al. .......... 438/300
2007/0048956 A1   3/2007 Dip et al.

OTHER PUBLICATIONS

Wolf, "Silicon Processing for the VLSI ERA", vol. 1, p. 177-179, Lattice Press, California (1986).*

* cited by examiner

*Primary Examiner*—Asok K Sarkar
(74) *Attorney, Agent, or Firm*—Oblon, Spivak, McClelland, Maier & Neustadt, P.C.

(57) ABSTRACT

A method for selectively forming an epitaxial Si containing film on a semiconductor structure at low temperature. The method includes providing the structure in a process chamber, the structure containing a Si substrate having an epitaxial Si surface area and a patterned film area thereon. A Si film is non-selectively deposited onto the structure, the Si film comprising an epitaxial Si film deposited onto the epitaxial Si surface and a non-epitaxial Si film deposited onto an exposed surface of the patterned film. The non-epitaxial Si film is selectively dry etched away to form a patterned epitaxial Si film. The Si film may be a SiGe film.

26 Claims, 5 Drawing Sheets

LOW TEMPERATURE FORMATION OF PATTERNED EPITAXIAL SI CONTAINING FILMS

CROSS REFERENCE TO RELATED APPLICATIONS

The present invention is related to U.S. patent application Ser. No. 10/673,375, titled "DEPOSITION OF SILICON-CONTAINING FILMS FROM HEXACHLORODISILANE" the entire content of which are hereby incorporated herein by reference.

FIELD OF THE INVENTION

The present invention relates to semiconductor processing, and more particularly, to forming epitaxial Si containing on a substrate.

BACKGROUND OF THE INVENTION

As circuit geometries shrink to ever smaller feature sizes, lower deposition temperatures may be preferred for depositing Si and SiGe films, for example due to introduction of new materials into semiconductor devices and the requirement for reduction of thermal budgets of shallow implants in source and drain regions. Moreover, it is evident that Si-containing films having a blanket coverage of a substrate and such films having patterned coverage of a substrate will be needed for future devices. Currently, Si-containing films having patterned coverage are provided through selective deposition wherein different deposition characteristics are present on different substrate materials. For example, some Si-containing gases deposit Si films on Si surfaces but not on oxide and nitride surfaces.

However, such selective deposition typically requires a substrate temperature above about 700° C. Due to reduced thermal budgets noted above, it is desirable for many applications to deposit Si-containing films at substrate temperatures below about 700° C. However, deposition selectivity may be lost at these low substrate temperatures, and unintended non-selective deposition can result over the whole substrate including any structures formed on the substrate. This blanket coverage of the substrate makes necessary additional lithography and etch steps to remove the film from the unwanted areas of the substrate to form the desired pattern. These additional steps reduce throughput and increase the expense of forming patterned Si containing layers.

SUMMARY OF THE INVENTION

Thus, one object of the present invention is to address problems associated with current methods for forming of patterned Si containing films on substrates.

Another object of the present invention is to provide a method for forming patterned Si containing films at low temperatures.

According to an embodiment of the invention, a method is provided for forming a patterned epitaxial Si film on a semiconductor structure at low substrate temperature. The method includes providing the structure in a process chamber, the structure containing a Si substrate having an epitaxial Si surface area and a patterned film area thereon. A Si film is non-selectively deposited onto the structure, the Si film including an epitaxial Si film deposited onto the epitaxial Si surface and a non-epitaxial Si film deposited onto an exposed surface of the patterned film. The non-epitaxial Si film is selectively dry etched away to form a patterned epitaxial Si film.

According to another embodiment of the invention, a method is provided for forming a patterned epitaxial SiGe film on a semiconductor structure at low substrate temperature. The method includes providing the structure in a process chamber, the structure containing a SiGe substrate having an epitaxial SiGe surface area and a patterned film area thereon. A SiGe film is non-selectively deposited onto the structure, the SiGe film including an epitaxial SiGe film deposited onto the epitaxial SiGe surface and a non-epitaxial SiGe film deposited onto an exposed surface of the patterned film. The non-epitaxial SiGe film is selectively dry etched away to form a patterned epitaxial SiGe film.

DETAILED DESCRIPTION OF SEVERAL EMBODIMENTS OF THE INVENTION

Figure 1:
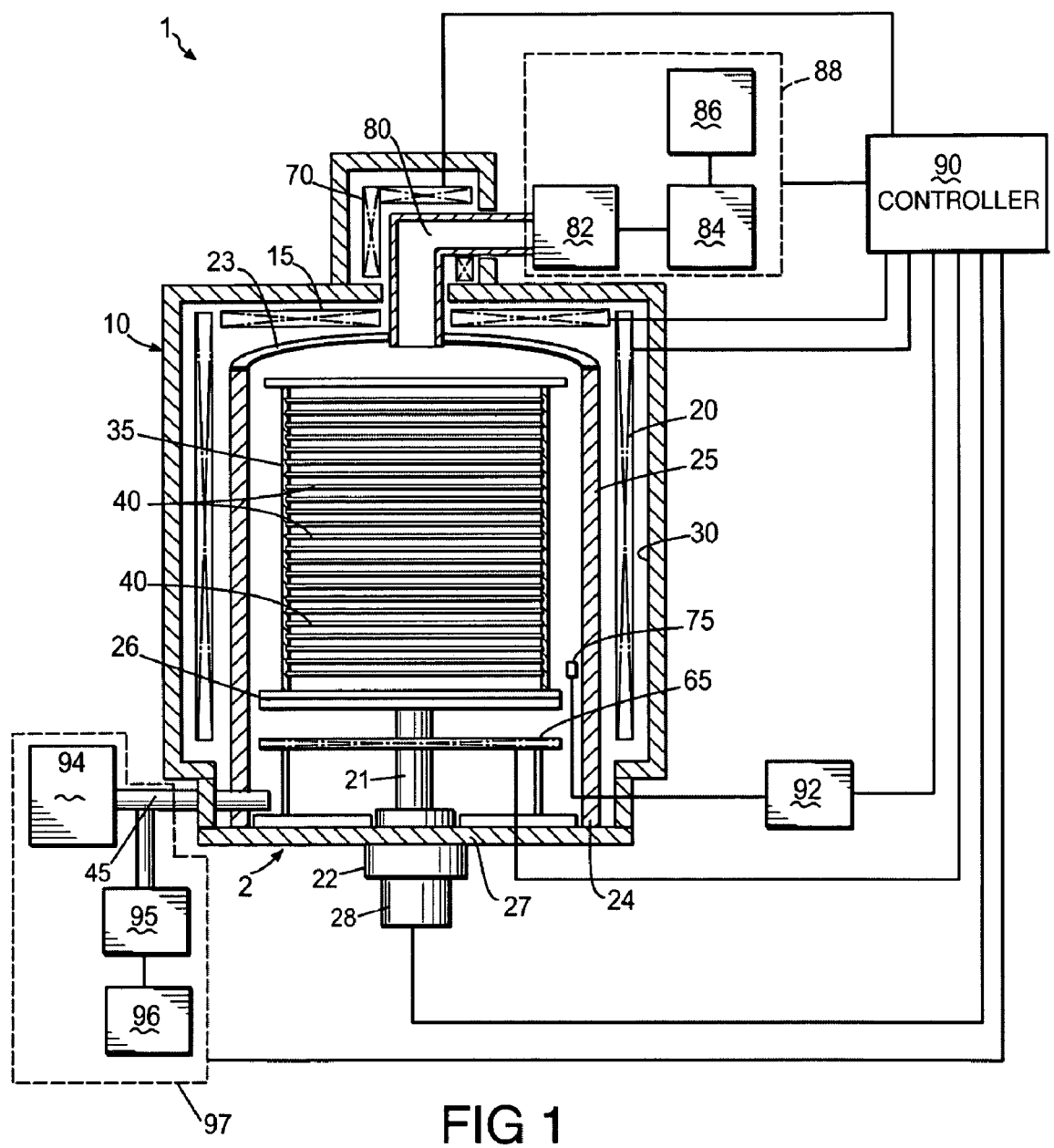
FIG. 1 shows a simplified block diagram of a batch processing system according to an embodiment of the invention.

As noted in the Background section above, selective deposition to form patterned Si containing films requires high substrate temperatures that are undesirable for thermal budgets of current and future processes. Moreover, reduced temperatures during deposition result in loss of selectivity, which necessitates additional lithography steps to create the desired pattern. Based on these recognitions, the present inventors have discovered that non-selective epitaxial growth on a substrate, followed by a selective dry etch process can be used to provide a patterned Si containing film at low temperature and without the need for lithography steps.

Epitaxial deposition is a process where the crystal lattice of the single crystal substrate is extended through deposition of a new epitaxial (single crystal) film that may have a different doping level than the bulk. Accordingly, a surface of an epitaxial Si (SiGe) substrate or film is required for depositing an epitaxial Si (SiGe) film thereon. Prior to depositing a Si-containing film on a substrate, for example epitaxial Si or epitaxial SiGe films, it may be required to remove a native oxide layer from the surface of the substrate in order to prepare a proper starting growth surface (i.e., a seed layer) to deposit a high quality epitaxial film. Where a proper seed layer is not provided, non-epitaxial growth of the Si containing layer will occur. Thus, non-selective deposition on a masked substrate, for example, will result in an epitaxial film deposited on seed areas, while a non-epitaxial layer is deposited on the masked areas.

Moreover, the present inventors have recognized that a dry etching process that provides higher etch rates for non-epitaxial Si containing films compared to epitaxial Si containing films, can be used in order to selectively remove the non-epitaxial Si containing films from the substrate while the epitaxial Si containing film is not substantially etched. The crystallographic structure of the non-epitaxial Si containing film can be polycrystalline or amorphous. In one example, the etch rate for a polycrystalline Si (poly-Si) film is much greater than the etch rate for an epitaxial Si film when using an etching gas containing fluorine ($F_2$).

Thus, according to one embodiment of the invention, a method is provided for processing a semiconductor structure. The includes providing the structure in a process chamber, the structure comprising a substrate and a patterned film formed thereon, removing an oxide layer from the substrate to reveal an epitaxial Si surface, non-selectively depositing a Si film onto the structure, the Si film comprising an epitaxial Si film deposited onto the epitaxial Si surface and a non-epitaxial Si film deposited onto an exposed surface of the patterned film, and selectively dry etching away the non-epitaxial Si film to form a patterned epitaxial Si film.

In the following description, in order to facilitate a thorough understanding of the invention and for purposes of explanation and not limitation, specific details are set forth, such as a particular geometry of the batch processing system and descriptions of various components. However, it should be understood that the invention may be practiced in other embodiments that depart from these specific details.

Referring now to the drawings, FIG. 1 shows a simplified block diagram of a batch processing system according to an embodiment of the invention. The batch processing system 1 contains a process chamber 10 and a process tube 25 that has an upper end 23 connected to an exhaust pipe 80, and a lower end 24 hermetically joined to a lid 27 of cylindrical manifold 2. The exhaust pipe 80 discharges gases from the process tube 25 to a vacuum pumping system 88 to maintain a pre-determined atmospheric or below atmospheric pressure in the processing system 1. A substrate holder 35 for holding a plurality of substrates (wafers) 40 in a tier-like manner (in respective horizontal planes at vertical intervals) is placed in the process tube 25. The substrate holder 35 resides on a turntable 26 that is mounted on a rotating shaft 21 penetrating the lid 27 and driven by a motor 28. The turntable 26 can be rotated during processing to improve overall film uniformity or, alternately, the turntable can be stationary during processing. The lid 27 is mounted on an elevator 22 for transferring the substrate holder 35 in and out of the process tube 25. When the lid 27 is positioned at its uppermost position, the lid 27 is adapted to close the open end of the manifold 2.

A gas delivery system 97 is configured for introducing gases into the process chamber 10. A plurality of gas supply lines can be arranged around the manifold 2 to supply a plurality of gases into the process tube 25 through the gas supply lines. In FIG. 1, only one gas supply line 45 among the plurality of gas supply lines is shown. The gas supply line 45 shown, is connected to a first gas source 94. In general, the first gas source 94 can supply gases for processing the substrates 40, including gases for forming films (e.g., silicon-containing gases for depositing silicon-containing films) onto the substrates 40, or an etching gas for dry etching the substrates 40.

In addition, or in the alternate, one or more of the gases can be supplied from the (remote) plasma source 95 that is operatively coupled to a second gas source 96 and to the process chamber 10 by the gas supply line 45. The plasma-excited gas is introduced into the process tube 25 by the gas supply line 45. The plasma source 95 can, for example, be microwave plasma source, a radio frequency (RF) plasma source, or a plasma source powered by light radiation. In the case of a microwave plasma source, the microwave power can be between about 500 Watts (W) and about 5,000 W. The microwave frequency can, for example, be 2.45 GHz or 8.3 GHz. In one example, the remote plasma source can be a Downstream Plasma Source Type AX7610, manufactured by MKS Instruments, Wilmington, Mass., USA.

A cylindrical heat reflector 30 is disposed so as to cover the reaction tube 25. The heat reflector 30 has a mirror-finished inner surface to suppress dissipation of radiation heat radiated by main heater 20, bottom heater 65, top heater 15, and exhaust pipe heater 70. A helical cooling water passage (not shown) can be formed in the wall of the process chamber 10 as a cooling medium passage. The heaters 20, 65, and 15 can, for example, maintain the temperature of the substrates 40 between about 20° C. and about 900° C.

The vacuum pumping system 88 comprises a vacuum pump 86, a trap 84, and automatic pressure controller (APC) 82. The vacuum pump 86 can, for example, include a dry vacuum pump capable of a pumping speed up to 20,000 liters per second (and greater). During processing, gases can be introduced into the process chamber 10 via the gas supply line 45 of the gas delivery system 97 and the process pressure can be adjusted by the APC 82. The trap 84 can collect unreacted precursor material and by-products from the process chamber 10.

The process monitoring system 92 comprises a sensor 75 capable of real-time process monitoring and can, for example, include a mass spectrometer (MS), a Fourier Transform Infrared (FTIR) spectrometer, or a particle counter. A controller 90 includes a microprocessor, a memory, and a digital I/O port capable of generating control voltages sufficient to communicate and activate inputs to the processing system 1 as well as monitor outputs from the processing system 1. Moreover, the controller 90 is coupled to and can exchange information with gas delivery system 97, motor 28, process monitoring system 92, heaters 20, 15, 65, and 70, and vacuum pumping system 88. The controller 90 may be implemented as a DELL PRECISION WORKSTATION 610™. The controller 90 may also be implemented as a general purpose computer, processor, digital signal processor, etc., which causes a substrate processing apparatus to perform a portion or all of the processing steps of the invention in response to the controller 90 executing one or more sequences of one or more instructions contained in a computer readable medium. The computer readable medium or memory for holding instructions programmed according to the teachings of the invention and for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

The controller 90 may be locally located relative to the processing system 1, or it may be remotely located relative to the processing system 1 via an internet or intranet. Thus, the controller 90 can exchange data with the processing system 1 using at least one of a direct connection, an intranet, and the internet. The controller 90 may be coupled to an intranet at a customer site (i.e., a device maker, etc.), or coupled to an intranet at a vendor site (i.e., an equipment manufacturer). Furthermore, another computer (i.e., controller, server, etc.) can access controller 90 to exchange data via at least one of a direct connection, an intranet, and the internet.

It is to be understood that the batch processing system 1 depicted in FIG. 1 is shown for exemplary purposes only, as many variations of the specific hardware can be used to practice the present invention, and these variations will be readily apparent to one having ordinary skill in the art. The processing system 1 in FIG. 1 can, for example, process substrates of any size, such as 200 mm substrates, 300 mm substrates, or even larger substrates. Furthermore, the processing system 1 can simultaneously process up to about 200 substrates, or more. Alternately, the processing system 1 can simultaneously process up to about 25 substrates.

Figure 2:
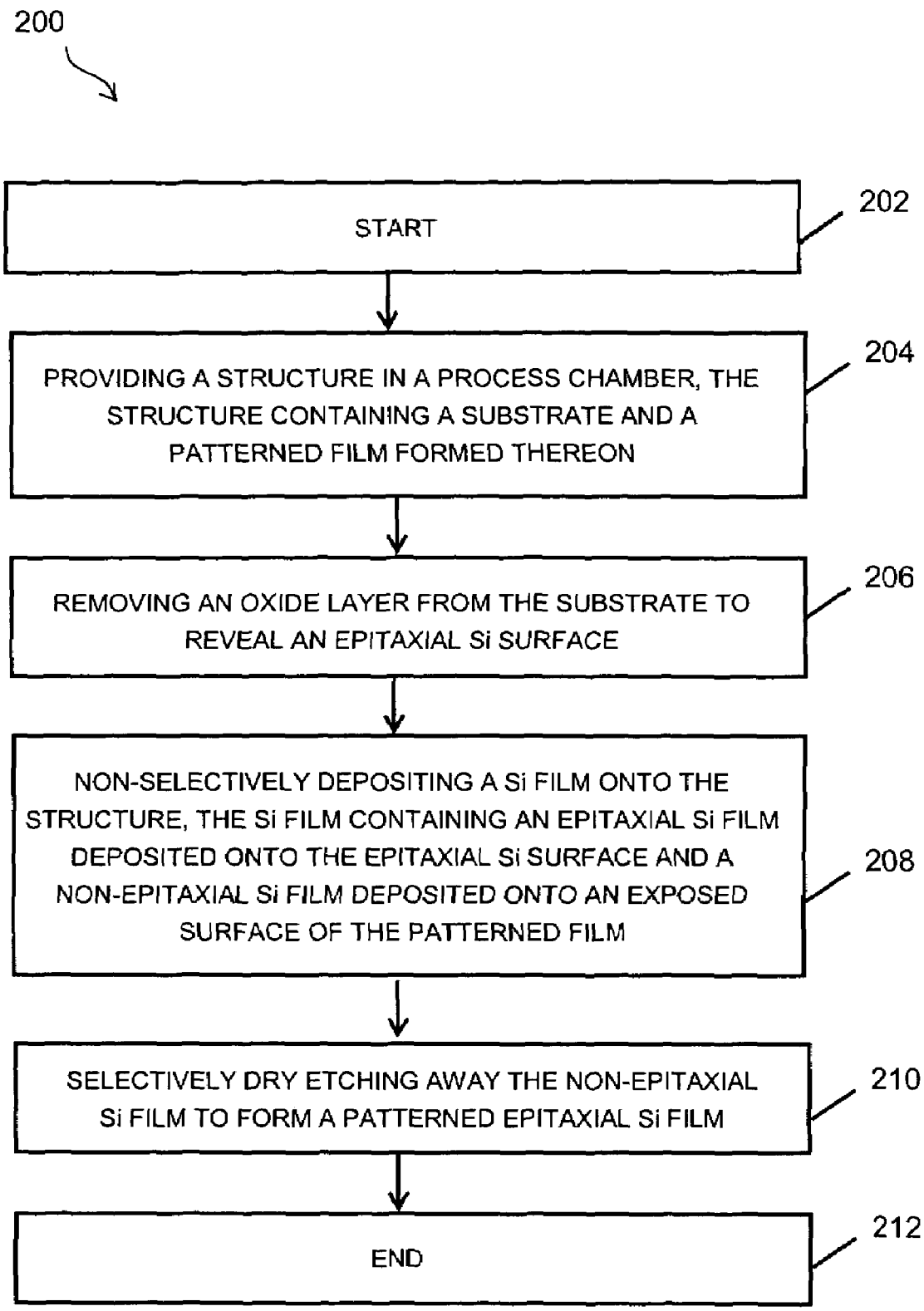
FIG. 2 is a flow diagram for forming a patterned epitaxial Si film on a substrate according to an embodiment of the invention.

Reference will now be made to FIG. 2 and FIG. 4. FIG. 2 is a flow diagram for forming a patterned epitaxial Si film on a semiconductor structure according to an embodiment of the invention and FIGS. 4A-4E schematically show formation of a patterned epitaxial Si film on a semiconductor structure 400 according to an embodiment of the invention. In FIG. 2, the process 200 starts at 202. In step 204, a semiconductor structure 400 containing a substrate 410 and a patterned film 430 formed thereon is provided in a process chamber. The process chamber can, for example, be the process chamber 10 of the batch processing system 1 depicted in FIG. 1. Alternatively, the processing system can be a single wafer processing system. According to the embodiment of the invention described in FIGS. 2 and 4, the substrate 410 is an epitaxial bulk Si substrate. As will be readily appreciated by those of ordinary skill in the art, the patterned film 430 may be any patterned film used in semiconductor manufacturing. The patterned film 430 can, for example, be a photolithographically formed film, for example a photoresist film, a hard mask, a dielectric film, a low-k film, or a high-k film, or a combination thereof.

Figure 4A:
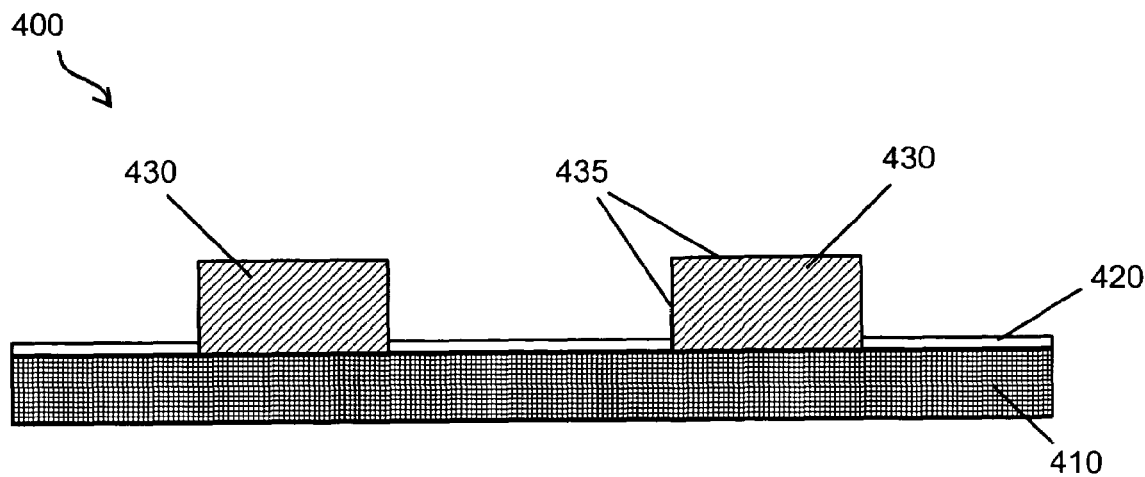
FIGS. 4A-4E schematically show formation of a patterned epitaxial Si or SiGe film on a substrate according to an embodiment of the invention.
Figure 4B:
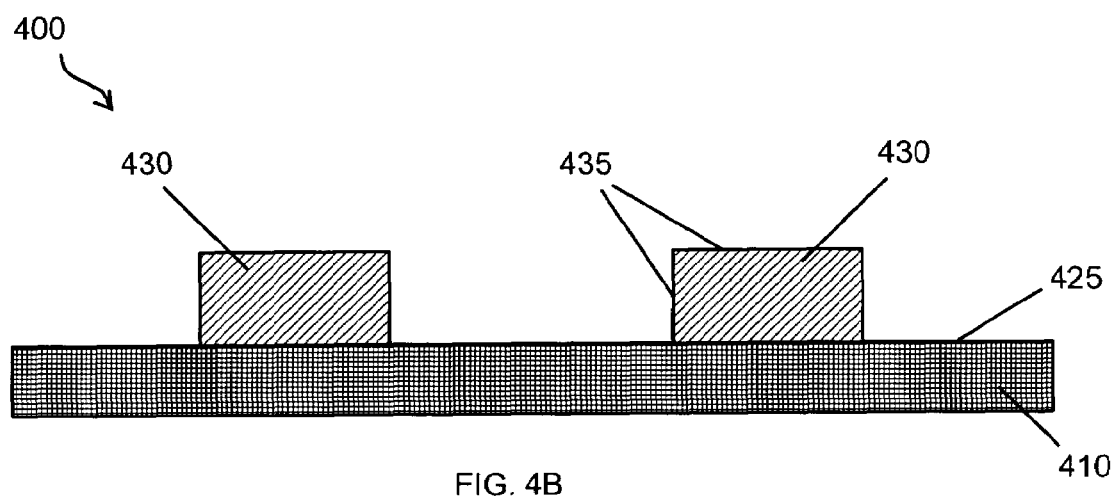

The substrate 410 depicted in FIG. 4A contains an oxide layer 420 formed thereon. The oxide layer 420 may be a native oxide layer that forms easily on the substrate 410 when exposed to air, even at room temperature. In addition to inhibiting proper film seeding and epitaxial film growth, the presence of the oxide layer 420 can also reduce deposition selectivity on different substrate materials. The oxide layer 420 is removed from the substrate 410 in step 206. Removal of the oxide layer 420, and any other surface contamination, reveals a clean epitaxial Si surface 425 that enables subsequent deposition of an epitaxial Si film on the exposed substrate surface 425 where the crystal lattice of the bulk substrate 410 is extended through growth of a new epitaxial film as shown in FIG. 4B. Exemplary methods and systems for removing an oxide layer from a substrate are described in co-pending U.S. patent applications Ser. No. 11/094,462, titled "A METHOD AND SYSTEM FOR REMOVING AN OXIDE FROM A SURFACE", and Ser. No. 11/206,056, titled "LOW-TEMPERATURE OXIDE REMOVAL USING FLOURINE," filed on even date herewith, the entire contents of both are hereby incorporated by reference. Although not shown in FIGS. 4A and 4B, surfaces of the patterned film 430 may also contain an oxide layer or other surface contaminants that are removed in step 206.

Alternately, the step 206 may omitted from the process 200 if, for example, the substrate 410 is clean of any oxide or other surface contaminants when provided in the process chamber.

Figure 4C:
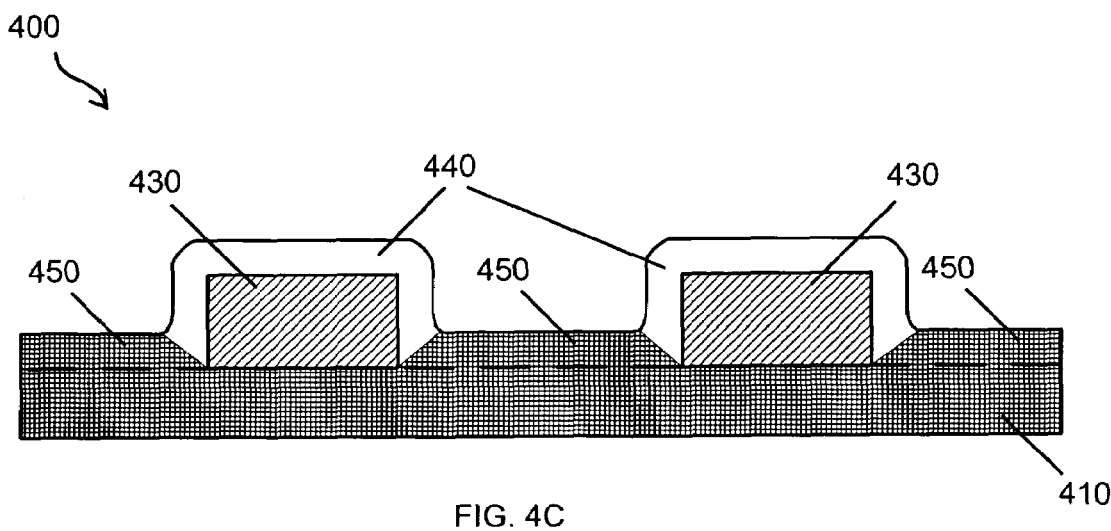

In step 208, a Si film is non-selectively deposited onto the structure 400. The Si film contains an epitaxial Si film 450 deposited onto the epitaxial Si surface 425 and a non-epitaxial Si film 440 deposited onto the exposed surfaces 435 of the patterned film 430, as shown in FIG. 4C. The epitaxial surface 425 acts (after removal of the oxide layer 420) as a seed layer for the epitaxial Si film 450, resulting in the crystal lattice of the substrate 410 being extended through deposition of the epitaxial Si film 450. Since the exposed surfaces of the patterned film 450 do not possess the required crystal lattice of epitaxial Si, a non-epitaxial Si film 440 containing poly-Si or amorphous Si is deposited on the exposed surfaces of the patterned film 450. In one example, the substrate temperature can be varied to control whether poly-Si or amorphous Si is deposited onto the patterned film 450. For example, the Si film may change from an amorphous Si film to a poly-Si film in a substrate temperature range of about 480° C. to about 540° C. In one example, an amorphous Si may be deposited at a substrate temperature below about 530° C. and a poly-Si film may be deposited at a substrate temperature above about 530° C. The grain size of a poly-Si film generally increases with increasing substrate temperature but the grain size may also depend on the silicon-containing deposition gas and the processing pressure. Furthermore, the addition of a Ge-containing gas to the Si-containing gas to deposit a SiGe film can lower the substrate temperature at which an amorphous film is deposited.

The Si film is deposited by exposing the substrate to a Si-containing gas. The Si-containing gas can contain $SiH_4$, $SiCl_4$, $SiHCl_3$, $SiH_2Cl_2$, $SiH_3Cl$, or $Si_2Cl_6$, or a combination of two or more thereof. The Si-containing gas can further contain inert gas, $Cl_2$, $H_2$, HCl, or H, or a combination of two or more thereof. The inert gas can contain $N_2$ or a noble gas (e.g., Ar). As noted above, the dry etching step of the present invention provides selective etching to provide patterned Si containing film. Thus, the substrate temperature during deposition can be selected in consideration of the overall thermal budget or the desired deposition rate. The substrate temperature can be between about 200° C. and about 700° C. According to one embodiments of the invention, the substrate temperature can be between about 400° C. and about 600° C., or between about 550° C. and about 650° C. According to an embodiment of the invention, the gas pressure in the process chamber can be between about 0.1 Torr and about 10 Torr, but this pressure range is not required for the invention, as other pressures may be used.

Figure 4D:
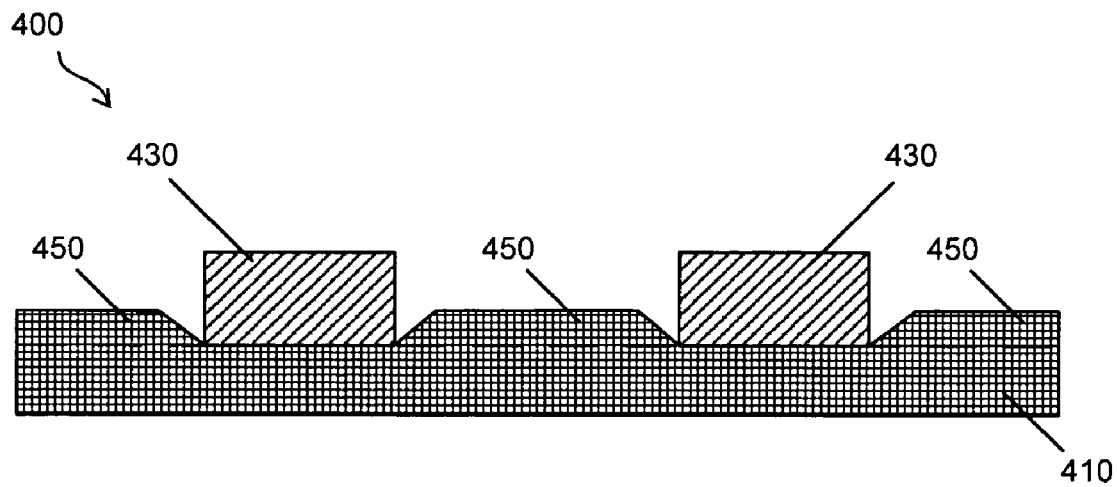

In step 210, a selective dry etching process is performed to etch away the non-epitaxial Si film 440 from the structure 400 and form a patterned epitaxial Si film 450 depicted in FIG. 4D. The higher etch rate of the non-epitaxial Si film 440 relative to the epitaxial Si film 450 and the patterned film 430 allows for efficient removal of the non-epitaxial Si film 440 while the epitaxial Si film 450 is not substantially etched. The dry etching process can be performed by exposure to an etching gas comprising $F_2$, $NF_3$, $ClF_3$, $Cl_2$, $H_2$, HF, HCl, or H, or a combination of two or more thereof. Embodiments of the invention are not limited to these etching gases, as other etching gases that provide different etching rates for non-epitaxial Si films relative to epitaxial Si films. The etching gas can further contain an inert gas such as $N_2$ or a noble gas (e.g., Ar). The inert gas can be used to control the concentration of the etchant species in the etching gas.

The selective dry etching process is carried out for a time period that results in the desired removal of the non-epitaxial Si film 440. The etching gas can be selected in view of a desired etch rate of the non-epitaxial Si film relative to the etch rate of the epitaxial Si film and the patterned film 430. According to one embodiment of the invention, the etching gas may thermally react with the non-epitaxial Si film 440. Alternately, the etching gas may be excited by a plasma source (e.g., remote plasma source 95 depicted in FIG. 1) to enhance the removal rate of the non-epitaxial Si film 440. In one example, the following etch rates were obtained by thermally reacting an etching gas containing $F_2$ with different materials: 0.1 Angstrom (A)/min for oxide, 0.5 A/min for nitride, and 3.25 A/min for non-epitaxial Si (poly-Si). The etching conditions included a substrate temperature of 200° C., $F_2$ gas flow rate of 200 sccm, $N_2$ gas flow rate of 8800 sccm, and process pressure of 1 Torr.

The dry etching step 210 may be carried out at a substrate temperature below which the Si film is transformed from an amorphous Si film to a poly-Si film if an amorphous Si film provides better etch selectivity to the epitaxial Si than a poly-Si film does. In one example, the dry etching step 210 may be carried out at a substrate temperature between about 100° C. and about 450° C. to reduce the conversion of an amorphous Si film to a poly-Si film.

Although not shown in FIG. 2, purging steps may be performed in between two or more steps of the process 200. For example, the process chamber may be purged after the oxide removal step 206, after step 208 to remove the silicon-containing gas and reaction by-products from the process chamber, and after step 210 to remove the etching gas and etch by-products from the process chamber. The purge gas can, for example, contain $H_2$ and/or an inert gas such as $N_2$ or a noble gas. In one example, $H_2$ may be used in step 208 and/or in step 210 and as a purging gas between steps 208 and 210. Furthermore, one or more of the purge steps may be replaced or complimented with pump down steps where no purge gas is flowed.

The thickness of the epitaxial Si film 450 can, for example, be between about 10 nm and about 100. In another example, the thickness can be between about 20 nm and about 70 nm, but this is not required for embodiments of the invention.

The Si film may be doped by adding a dopant gas to the chlorinated silane gas, the dry etching gas, or the purge gas. The dopant gas can, for example, contain $PH_3$, $AsH_3$, $B_2H_6$, or $BCl_3$, to dope the Si films with P, As, or B, respectively. In one example, a dopant gas may a replace $H_2$ as a purge gas. It is contemplated that a sufficiently long exposure of a dopant gas will result in a highly doped Si film that can, for example, be used for raised source/drain applications. In general, doping concentration less than saturation can be achieved by controlling the exposure time to a dopant gas.

According to an embodiment of the invention, substrate temperature can be between about 200° C. and about 700° C. during one or more of the steps of the process 200. According to one embodiments of the invention, the substrate temperature can be between about 400° C. and about 600° C., or between about 550° C. and about 650° C. According to an embodiment of the invention, the gas pressure in the process chamber during one or more of the steps of the process 200 can be between about 0.1 Torr and about 10 Torr, but this pressure range is not required for the invention, as other pressures may be used without departing from the scope of the invention.

According to an embodiment of the invention, two or more of the steps of the process 200 may be performed in the same processing system, such as batch processing system 1 shown in FIG. 1. In one example, the oxide removal step 206 and the Si film deposition step 208 may be performed in the same processing system without exposing the structure to air to prevent formation of new oxide layer on the substrate prior depositing a Si film in step 208. In another example, steps 206, 208, 210 may be carried out in the same processing system.

According to still another embodiment, the dry etching in step 210 performs a dual purpose of etching the non-epitaxial film and liberating contaminants from the epitaxial film. Specifically, where chlorinated silane gas is used for the non-selective deposition step 208, chlorine may remain in the deposited film thereby altering the film properties. Co-pending U.S. application Ser. No. 11/206,199, filed on even date herewith discloses a method for reducing the amount of chlorine contaminants in a deposited film by a dry etching process. The entire content of this application is incorporated herein by reference. Thus, where chlorinated silane gas is used in step 208, step 210 may provide for etching of the non-epitaxial film as well as liberating chlorine from the epitaxial film.

Figure 4E:
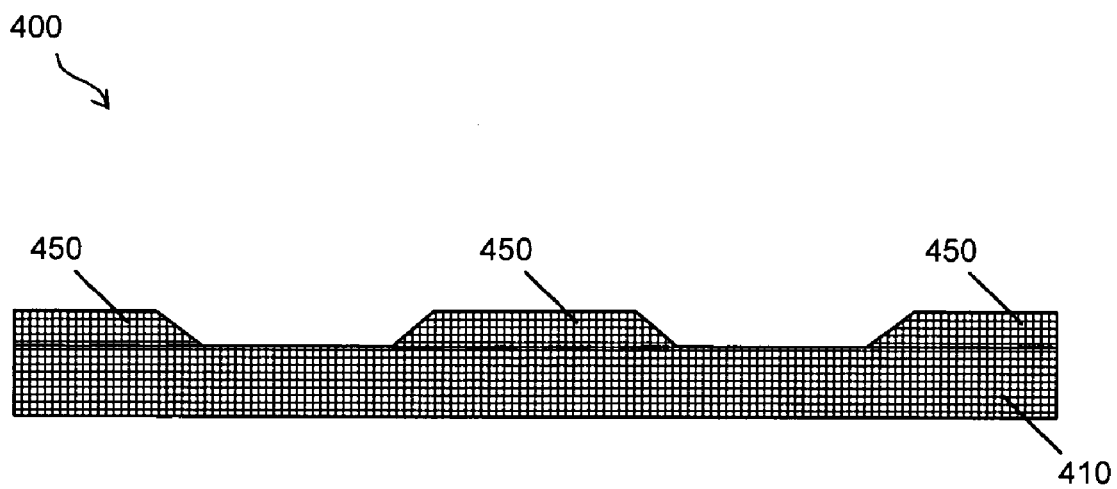

FIG. 4E shows the structure 400 following further processing where the patterned film 430 has been removed from the structure 400. The patterned film 430 may be removed utilizing any etching process (dry or wet etching) that provides high selectivity between the patterned film 430 and the patterned epitaxial Si film 450 and the epitaxial Si substrate 410. According to one embodiment of the invention, the patterned epitaxial Si film 450 can form raised Si source/drain regions of a semiconductor device.

Figure 3:
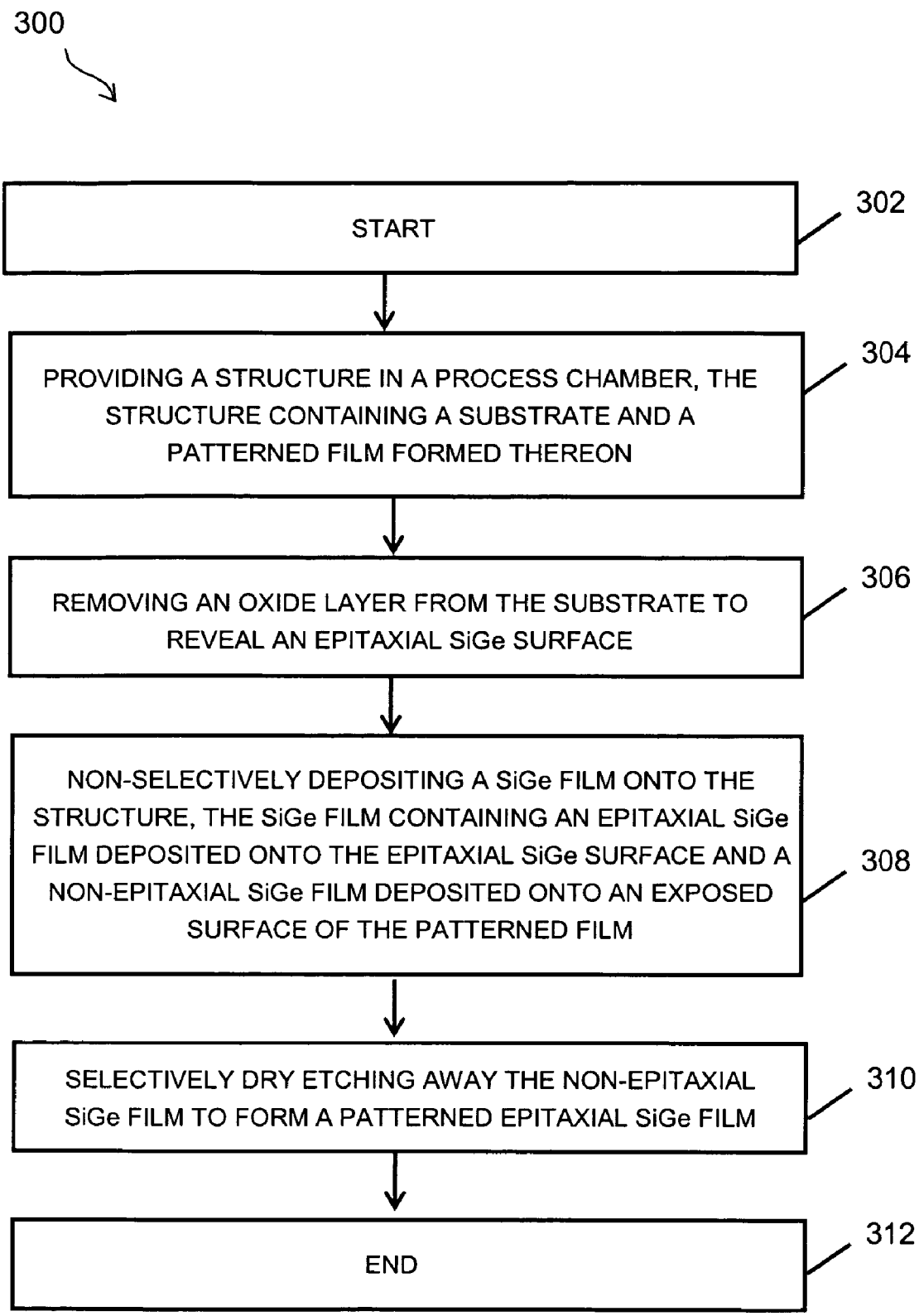
FIG. 3 is a flow diagram for forming a patterned epitaxial SiGe film on a substrate according to an embodiment of the invention.

Reference will now be made to FIG. 3 and FIG. 4. FIG. 3 is a flow diagram for forming a patterned epitaxial SiGe film on a semiconductor structure according to an embodiment of the invention and FIGS. 4A-4E schematically show formation of a patterned epitaxial SiGe film on a semiconductor structure according to an embodiment of the invention. According to the embodiment of the invention described in FIGS. 2 and 4, the substrate 410 is an epitaxial bulk SiGe substrate.

In the flowchart of FIG. 3, the steps 302-306 of the process 300 correspond to steps 202-204 of the process 200 described above in reference to FIG. 2.

In step 308, a SiGe film is non-selectively deposited onto the structure 400. The SiGe film contains an epitaxial SiGe film 450 deposited onto the epitaxial SiGe surface 425 and a non-epitaxial SiGe film 440 deposited onto the exposed surfaces 435 of the patterned film 430. The SiGe film is deposited by exposing the substrate to a Si-containing gas and a Ge-containing gas. The composition of the SiGe film can, for example, be selected by varying the ratio of the Si-containing gas to the Ge-containing gas. The Si-containing gas can contain $SiH_4$, $SiCl_4$, $SiHCl_3$, $SiH_2Cl_2$, $SiH_3Cl$, or $Si_2Cl_6$, or a combination of two or more thereof. The Ge-containing gas can contain $GeH_4$ or $SiCl_4$, or a combination thereof. The Si-containing gas and the Ge-containing gas can further contain inert gas, $Cl_2$, $H_2$, HCl, or H, or a combination of two or more thereof. Embodiments of the invention are not limited to these etching gases, as other etching gases that provide different etching rates for non-epitaxial SiGe films relative to epitaxial SiGe films. The inert gas can contain $N_2$ or a noble gas (e.g., Ar).

According to an embodiment of the invention, substrate temperature can be between about 200° C. and about 700° C. during one or more of the steps of the process 200. According to one embodiments of the invention, the substrate temperature can be between about 400° C. and about 600° C., or between about 550° C. and about 650° C. According to an embodiment of the invention, the gas pressure in the process chamber during one or more of the steps of the process 200 can be between about 0.1 Torr and about 10 Torr, but this pressure range is not required for the invention, as other pressures may be used without departing from the scope of the invention.

In step 310, a selective dry etching process is performed to etch away the non-epitaxial SiGe film 440 from the structure 400 and form a patterned epitaxial SiGe film 450. The higher etch rate of the non-epitaxial SiGe film 440 relative to the epitaxial SiGe film 450 and the patterned film 430 allows for efficient removal of the non-epitaxial SiGe film 440 while the epitaxial SiGe film 450 is not substantially etched. The dry etching process can be performed by exposure to an etching gas comprising $F_2$, $NF_3$, $ClF_3$, $Cl_2$, $H_2$, HF, HCl, or H, or a combination of two or more thereof. The etching gas can further contain an inert gas such as $N_2$ or a noble gas (e.g., Ar). The inert gas can be used to control the concentration of the etchant species in the etching gas. The selective dry etching process is carried out for a time period that results in the desired removal of the non-epitaxial SiGe film 440. The etching gas can be selected in view of a desired etch rate of the non-epitaxial SiGe film relative to the etch rate of the epitaxial SiGe film and the patterned film 430. The process ends in step 312.

Although not shown in FIG. 3, purging steps may be performed in between two or more steps of the process 300. For example, the process chamber may be purged after the oxide removal step 306, after step 308 to remove the silicon-containing gas and the germanium-containing gas and reaction by-products from the process chamber, and after step 310 to remove the etching gas and etch by-products from the process chamber. The purge gas can, for example, contain $H_2$ and/or an inert gas such as $N_2$ or a noble gas. In one example, $H_2$ may be used in step 308 and/or in step 310 and as a purging gas between steps 308 and 310. Furthermore, one or more of the purge steps may be replaced or complimented with pump down steps where no purge gas is flowed.

The thickness of the epitaxial SiGe film 450 can, for example, be between about 10 nm and about 100 nm. In another example the thickness can be between about 20 nm and about 70 nm, but this is not required for embodiments of the invention.

The SiGe film may be doped by adding a dopant gas to the chlorinated silane gas, the dry etching gas, or the purge gas. The dopant gas can, for example, contain $PH_3$, $AsH_3$, $B_2H_6$, or $BCl_3$, to dope the SiGe films with P, As, or B, respectively. In one example, a dopant gas may a replace $H_2$ as a purge gas. It is contemplated that a sufficiently long exposure of a dopant gas will result in a highly doped SiGe film that can, for example, be used for raised source/drain applications. In general, doping concentration less than saturation can be achieved by controlling the exposure time to a dopant gas.

Analogously as described above for patterned epitaxial Si films, FIG. 4E shows a structure 400 containing a patterned epitaxial SiGe film 450 and an epitaxial SiGe substrate 410 following removal of the patterned film 430 in an etching process. According to one embodiment of the invention, the patterned epitaxial SiGe film 450 can form raised SiGe source/drain regions of a semiconductor device.

Although only certain embodiments of this invention have been described in detail above, those skilled in the art will readily appreciate that many modifications are possible in the exemplary embodiment without materially departing from the novel teachings and advantages of this invention. Accordingly, all such modifications are intended to be included within the scope of this invention.

What is claimed is:

1. A method of processing a semiconductor structure, comprising:
   providing the structure in a process chamber, the structure comprising a Si substrate having an epitaxial Si surface area and a patterned film area thereon;
   non-selectively depositing a Si film onto the structure, the Si film comprising an epitaxial Si film deposited onto the epitaxial Si surface and a non-epitaxial Si film deposited onto an exposed surface of the patterned film;
   selectively dry etching away the non-epitaxial Si film to form a patterned epitaxial Si film; and
   removing the patterned film from the structure in an etching process.

2. The method according to claim 1, further comprising removing a native oxide layer from the Si substrate to reveal said epitaxial Si surface area.

3. The method according to claim 2, wherein the removing comprises exposing the substrate to a cleaning gas comprising $F_2$, $NF_3$, $ClF_3$, $Cl_2$, $H_2$, HF, HCl, or H, or a combination of two or more thereof.

4. The method according to claim 1, wherein the patterned film comprises a photoresist film, a hard mask, a dielectric film, a low-k film, or a high-k film, or a combination thereof.

5. The method according to claim 1, wherein the non-selectively depositing a Si film comprises exposing the substrate to a silicon-containing gas.

6. The method according to claim 5, wherein the silicon-containing gas comprises $SiCl_4$, $SiHCl_3$, $SiH_2Cl_2$, $SiH_3Cl$, $SiH_4$, or $Si_2Cl_6$, or a combination of two or more thereof.

7. The method according to claim 5, wherein the silicon-containing gas further comprises an inert gas, $Cl_2$, $H_2$, HCl, or H, or a combination of two or more thereof.

8. The method according to claim 1, wherein the selectively dry etching comprises exposing the Si film to an etching gas comprising $F_2$, $NF_3$, $ClF_3$, $Cl_2$, $H_2$, HF, HCl, or H, or a combination of two or more thereof.

9. The method according to claim 1, further comprising providing the substrate at a temperature between about 200° C. and about 700° C.

10. The method according to claim 1, further comprising providing a gas pressure in the process chamber at between about 0.1 Torr and about 10 Torr.

11. The method according to claim 1, wherein two or more of the steps are performed in a batch processing system.

12. The method according to claim 1, wherein two or more of the steps are performed in the same processing system.

13. The method of claim 1, wherein
   said non-selectively depositing comprises depositing a chlorinated Si film onto the epitaxial Si surface, and
   said method further comprising reducing an amount of chlorine in said chlorinated Si film using said dry etching process.

14. A method of processing a semiconductor structure, comprising:
   providing the structure in a process chamber, the structure comprising a substrate having an epitaxial SiGe surface area and a patterned film area thereon;
   non-selectively depositing a SiGe film onto the structure, the SiGe film comprising an epitaxial SiGe film deposited onto the epitaxial SiGe surface and a non-epitaxial SiGe film deposited onto an exposed surface of the patterned film;
   selectively dry etching away the non-epitaxial SiGe film to form a patterned epitaxial SiGe film; and
   removing the patterned film from the structure in an etching process.

15. The method according to claim 1, further comprising removing a native oxide layer from the substrate to reveal said epitaxial SiGe surface area.

16. The method according to claim 15, wherein the removing comprises exposing the substrate to a cleaning gas comprising $F_2$, $NF_3$, $ClF_3$, $Cl_2$, $H_2$, HF, HCl, or H, or a combination of two or more thereof.

17. The method according to claim 14, wherein the patterned film comprises a photoresist film, a hard mask, a dielectric film, a low-k film, or a high-k film, or a combination thereof.

18. The method according to claim 14, wherein the non-selectively depositing a SiGe film comprises exposing the substrate to a silicon-containing gas and a germanium-containing gas.

19. The method according to claim 18, wherein the silicon-containing gas comprises $SiCl_4$, $SiHCl_3$, $SiH_2Cl_2$, $SiH_3Cl$, SiH$_4$, or Si$_2$Cl$_6$, or a combination of two or more thereof, and the germanium-containing gas comprises GeCl$_4$ or GeH$_4$, or a combination thereof.

20. The method according to claim 18, wherein the silicon-containing gas and the germanium-containing gas further comprise an inert gas, Cl$_2$, H$_2$, HCl, or H, or a combination of two or more thereof.

21. The method according to claim 14, wherein the selectively dry etching comprises exposing the SiGe film to an etching gas comprising F$_2$, Cl$_2$, H$_2$, HF, HCl, or H, or a combination of two or more thereof.

22. The method according to claim 14, further comprising providing the substrate at a temperature between about 200° C. and about 700° C.

23. The method according to claim 14, further comprising providing a gas pressure in the process chamber between about 0.1 Torr and about 10 Torr.

24. The method according to claim 14, wherein two or more of the steps are performed in a batch processing system.

25. The method according to claim 14, wherein two or more of the steps are performed in the same processing system.

26. A method of forming a semiconductor device, comprising:
   providing a semiconductor structure in a process chamber, the structure comprising a Si substrate having an epitaxial Si surface area and a patterned film area thereon;
   removing an oxide layer from the substrate to reveal an epitaxial Si surface;
   non-selectively depositing a Si film onto the structure, the Si film comprising an epitaxial Si film deposited onto the epitaxial Si surface and a non-epitaxial Si film deposited onto an exposed surface of the patterned film;
   selectively dry etching away the non-epitaxial Si film to form a patterned epitaxial Si film comprising raised Si source/drain regions; and
   removing the patterned film from the structure in an etching process.

* * * * *